United States Patent
Kusunoki (10) Patent No.: US 7,974,597 B2
(45) Date of Patent: Jul. 5, 2011

(54) POWER AMPLIFIER SYSTEM AND MOBILE PHONE TERMINAL USING SAME

(75) Inventor: Shigeo Kusunoki, Kanagawa (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 802 days.

(21) Appl. No.: 11/892,724

(22) Filed: Aug. 27, 2007

(65) Prior Publication Data

US 2008/0058001 A1 Mar. 6, 2008

(30) Foreign Application Priority Data

Sep. 1, 2006 (JP) .................................. 2006-238113

(51) Int. Cl.
*H01Q 11/12* (2006.01)
*H04B 1/04* (2006.01)

(52) U.S. Cl. .................. 455/127.1; 455/114.2; 330/200; 330/310

(58) Field of Classification Search .............. 455/114.2, 455/114.3, 127.1, 127.2, 127.3; 330/310, 330/311, 200
See application file for complete search history.

(56) References Cited

U.S. PATENT DOCUMENTS

| | | | |
|---|---|---|---|
| 6,639,464 B2 | 10/2003 | Hellberg et al. | |
| 6,810,241 B1 * | 10/2004 | Salib | 455/326 |
| 7,663,435 B2 * | 2/2010 | Kim et al. | 330/124 R |
| 2004/0056723 A1 * | 3/2004 | Gotou | 330/295 |
| 2005/0231286 A1 * | 10/2005 | Gotou et al. | 330/295 |
| 2007/0164818 A1 | 7/2007 | Horiguchi et al. | |

FOREIGN PATENT DOCUMENTS

| | | |
|---|---|---|
| EP | 1 562 286 A2 | 8/2005 |
| JP | 7-022952 | 1/1995 |
| JP | 2003-536313 | 12/2003 |
| JP | 2005-045767 | 2/2005 |
| JP | 2005-318373 A | 11/2005 |
| WO | WO-2005/124994 A1 | 12/2005 |

OTHER PUBLICATIONS

S. Kusunoki, et al. "Harmonic-Injected Power Amplifier with $2^{nd}$ Harmonic Short Circuit for Cellular Phones", IEICE Transaction on Electronics vol. E88-C, No. 4, Apr. 2005, pp. 729-738.

(Continued)

*Primary Examiner* — Christian A Hannon
(74) *Attorney, Agent, or Firm* — Rader, Fishman & Grauer PLLC (57) ABSTRACT

A power amplifier system includes a first power amplifier, a second harmonic generator, a phase shifter, and first and second adders. The first power amplifier amplifies a primary input signal. The second harmonic generator outputs a second harmonic by using a split part (signal) of the primary input signal as an input. The phase shifter adjusts a phase of the second harmonic. The first adder sums together a split signal of the primary input signal and an output of the phase shifter, thereby to produce an output. The second power amplifier uses the output of the first adder as an input. The second adder sums together an output of the first amplifier and an output of the second power amplifier, thereby to produce an output.

8 Claims, 5 Drawing Sheets

OTHER PUBLICATIONS

S. Kusunoki, et al. "Load-Impedance and Bias-Network Dependence of Power Amplifier with Second Harmonic Injection", IEEE Transactions on Microwave Theory and Techniques, Sep. 2004, vol. 52, No. 9, pp. 2169-2176.

Extended European Search Report dated Feb. 27, 2009 for corresponding European Application No. 07 25 3384.

Kusunoki, Shigeo, et al, "Harmonic-Injected Power Amplifier with 2nd Harmonic Short Circuit for Cellular Phones," XP-001228967, The Institute of Electronics, Information and Communication Engineers, Trans. Electron, vol. E88-C, No. 4—Apr. 2005, pp. 729-738.

Singh, Aarti, et a, "Second- and Third-Order Signal Predistortion for Nonlinear Distortion Suppression in a TWT," IEEE Transactions on Electron Devices, vol. 52, No. 5, May 2005, pp. 709-717.

Japanese Office Action issued Nov. 17, 2010 for corresponding Japanese Application No. 2006-238113.

* cited by examiner

POWER AMPLIFIER SYSTEM AND MOBILE PHONE TERMINAL USING SAME

The present invention contains subject matter related to Japanese Patent Applications JP 2006-238113 filed in the Japanese Patent Office on Sep. 1, 2006, the entire contents of which being incorporated herein by reference.

BACKGROUND OF THE INVENTION

1. Field of the Invention

The present invention relates to a power amplifier system. More specifically, the invention relates to an HF (high frequency) power amplifier system usable with a mobile phone terminal and an HF power frequency power amplifier system usable with a mobile phone terminal, and a mobile phone using the HF power amplifier system.

2. Description of the Related Art

As a tendency of recent mobile phones, the feed-forward speed of transmit/receive data increases. For example, according to high speed down Link packet access (HSDPA), a dedicated packet control channel (DPCCH) is added for high feed-forward speeds of data (downlink: 14 Mbps; uplink: 64 Kbps). Accordingly, a peak factor (rate between a peak power and an average power) is increased by about 1.5 dB in comparison to a normal case.

According to the EvDO (Evolution Data Only) Rev. 0, a supplement channel is added to thereby increase the feed-forward speed up to 156 Kbps. In this case, the peak factor is increased by about 1 dB, similar to the above.

Schemes are continually under development to achieve further increased feed-forward speed, and undoubtedly, the peak factors of signals will be further increased in the future. A feature of such a signal of a high peak factor is a high peak power. As such, a power amplifier for use is desired to be capable of implementing a high level saturation output, high efficiency, and low distortion. As a candidate of such an amplifier, an output-combining power amplifier, such as a Doherty amplifier, is now drawing attention.

Under these circumstances, various types of known or existing techniques are related to the present invention, and some of such techniques which will be briefly described herebelow as related art examples.

A first related art example is a "digital cross-cancellation (or "DCC") system," such as described in Patent Publication 1 (Japanese Unexamined Patent Application Publication No. 2005-45767) will be described here. According to the DCC system, a digital signal processor (or "DSP") is used to cancel signal distortion components in an output portion of a power amplifier. However, for use with a mobile phone, desired compactness cannot be achieved, and power consumption is significantly large because of the DSP being used.

A second related art example is a "multistage Doherty amplifier," such as described in Patent Publication 2 (PCT Japanese Translation Patent Publication No. 2003-536313). According to the technique, a large number of power amplifiers are used for drive amplifiers, and signal distortion generated by the respective power amplifier is minimized, thereby to implement distortion reduction. However, problems arise in that it is difficult to set a minimum distortion point of the respective amplifier, further, a distortion component contained in a final output is cannot be reduced lower than a distortion component generated in the respective amplifier.

A third related art example is a "microwave Doherty amplifier," such as described in Patent Publication 3 (Japanese Unexamined Patent Application Publication No. 1995-22952). According to the technique, a second harmonic short circuit is combined with a Doherty amplifier, thereby to implementing high efficiency and distortion reduction. However, a distortion reduction effect of the technique using the second harmonic short circuit is, at most, 3 dB, which is insufficient as described in Non-Patent Publication 1 (see (*1) below)

(*1): S. Kusunoki, et al., "Harmonic-Injected Power Amplifier with 2nd Harmonic Short Circuit for Cellular Phones", IEICE Transaction on Electronics vol. E88-C, No. 4, April 2005, pp. 729-738

SUMMARY OF THE INVENTION

As described above, the feature of the signal of high peak factor is the high peak power. In consideration of this fact, a power amplifier for use is desired to be capable of implementing high saturation output and low distortion. Candidates of such an amplifier include a Doherty amplifier. The amplifier is capable of implementing high saturation output and high efficiency. However, as compared with a class AB amplifier, the Doherty amplifier is less advantageous in terms of distortion reduction as it uses class C amplifiers.

Under these circumstances, it would be desirable to provide a power amplifier system capable of implementing high level saturation output, high efficiency, and low distortion, a mobile phone terminal using the power amplifier system.

According to an embodiment of the present invention, a power amplifier system includes a first power amplifier for amplifying a primary input signal; a second harmonic generator for outputting a second harmonic by using a split part (split signal) of the primary input signal as an input; a phase shifter for adjusting a phase of the second harmonic; a first adder for summing together the split signal of the primary input signal and an output of the phase shifter, thereby to produce an output; a second power amplifier that uses the output of the first adder as an input; and a second adder for summing together an output of the first amplifier and an output of the second power amplifier, thereby to produce an output.

The outputs of the first and second power amplifiers are summed together and combined thereby. According to the combination of the first and second power amplifiers, a high saturation output and a high efficiency can be obtained.

The second harmonic generator uses the split part of the primary input signal as the input, and thereby outputs a second harmonic. The phase shifter adjusts the phase of the second harmonic. An output of the phase shifter is output after being summed by the first adder to a split signal of the primary input signal. The output of the first adder is input to the second power amplifier. Thereby, when respective outputs of the first and second power amplifiers are summed together, distortions of the first and second power amplifiers are cancelled.

According to the above described, a high saturation output can be produced by combining the two power amplifiers, signal distortion can be greatly reduced in the manner that distortion signals are cross-cancelled by reverse phases.

BRIEF DESCRIPTION OF THE DRAWINGS

These and other objects, features and advantages of the present invention will be apparent from the following detailed description and the appended claims and drawings, in which:

DETAILED DESCRIPTION OF THE PREFERRED EMBODIMENT

One embodiment of the present invention will be described in detail herebelow with reference to the drawings.

Figure 1:
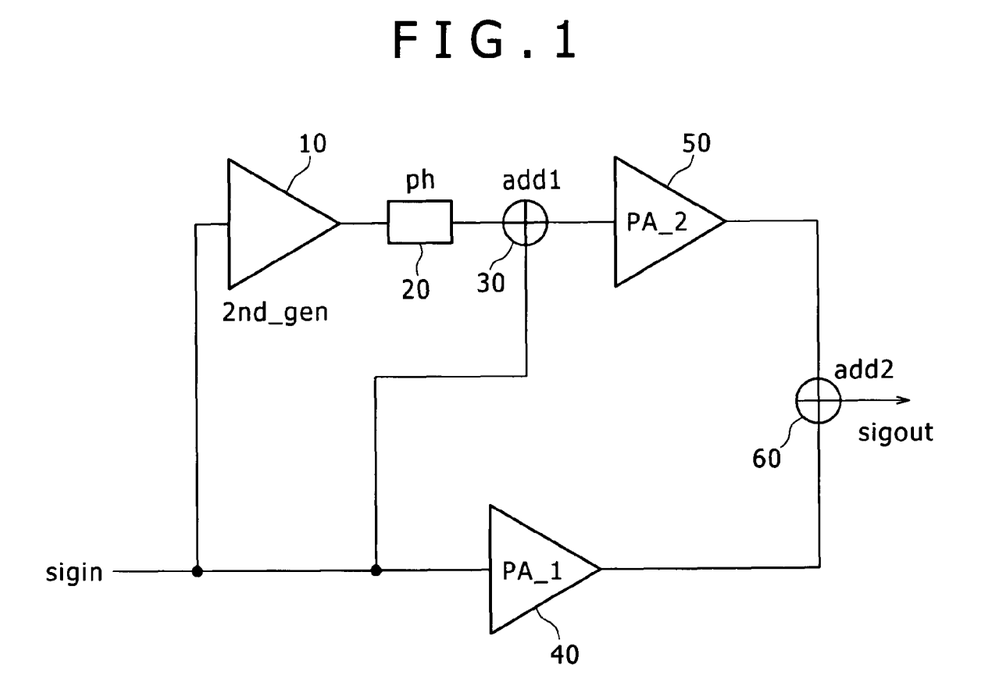
FIG. 1 is a block diagram of a general configuration of a power amplifier system of one embodiment of the present invention.

FIG. 1 is a block diagram of a general configuration of a power amplifier system of one embodiment of the present invention. The power amplifier system includes a first power amplifier 40 ("PA_1"), a second harmonic generator 10 ("2nd_gen"), a phase shifter 20 ("ph"), a first adder 30 ("add1"), a second power amplifier 50 ("PA_2"), and a second adder 60 ("add2"). The first power amplifier 40 ("PA_1") amplifies a primary input signal ("sigin"), and the second harmonic generator 10 splits the input signal ("sigin"), inputs a split part (signal), and then outputs a second harmonic. The phase shifter 20 adjusts the phase of the second harmonic. The first adder 30 ("add1") performs addition or summation of the split signal of the primary input signal ("sigin") and the output of the phase shifter 20, and produces an output as a result of the summation. The second power amplifier 50 inputs the output of the first adder 30 ("add1") for amplification. The second adder 60 ("add2") performs summation of the respective outputs of the power amplifiers 40 and 50, and in turn outputs an output signal ("sigout") as a result of the summation.

In the present embodiment, the power amplifier 40 is biased to the A or AB class, and the power amplifier 50 is biased to the class C. When a power value of the input signal ("sigin") is low (in comparison to a predetermined value), the power amplifier 40 enters an active mode, and the power amplifier 50 enters a pause mode. When the power value of the input signal ("sigin") increases to a level exceeding the predetermined value, the power amplifier 50 enters the active mode, and two outputs are summed together. In this event, the respective phases passing through the power amplifiers 40 and 50 are adjusted to the same value, whereby the outputs of the respective power amplifiers 40 and 50 are combined in the same phase.

Major operations of the power amplifier system of FIG. 1 will be described herebelow.

Generally, the power amplifier 40, 50 produces the output containing nonlinear distortion. For convenience, description will be made with reference to the third order intermodulation distortion (IM3). Further, it is contemplated that a general two-tone signal (frequency w1, w1+δ) represents the primary input signal ("sigin"). Where H3 is a third order nonlinear transfer function of the power amplifier, an IM3 component can be represented as: $H3 \cdot \exp(j \cdot (w1+2\delta+\theta))$. In this case, θ is the phase. The (w1−δ) components are not taken into account for the sake of simplicity of description. IM3 occurs in a similar manner from each of the two power amplifiers 40 and 50, and is summed by the second adder 60 ("add2"). The second adder 60 ("add2") is operated so that the respective components (signal components) of the frequencies W1 and W2 are summed together in the same phase, that is, the output of the signal components is maximized. The summation of IM3 components contained in the outputs of the respective power amplifiers is determined by the phases θ of the respective IM3 components. If the phases θ of the IM3 components can be set to be mutually reverse phases while the phases of the signal components are being carried, respective IM3 components contained in the output of the second adder 60 ("add2") are greatly cross-cancelled and hence reduced. According to the present invention, the above described is implemented in the manner that the second harmonic of the input signal ("sigin") is input into the second power amplifier 50.

Figure 2:
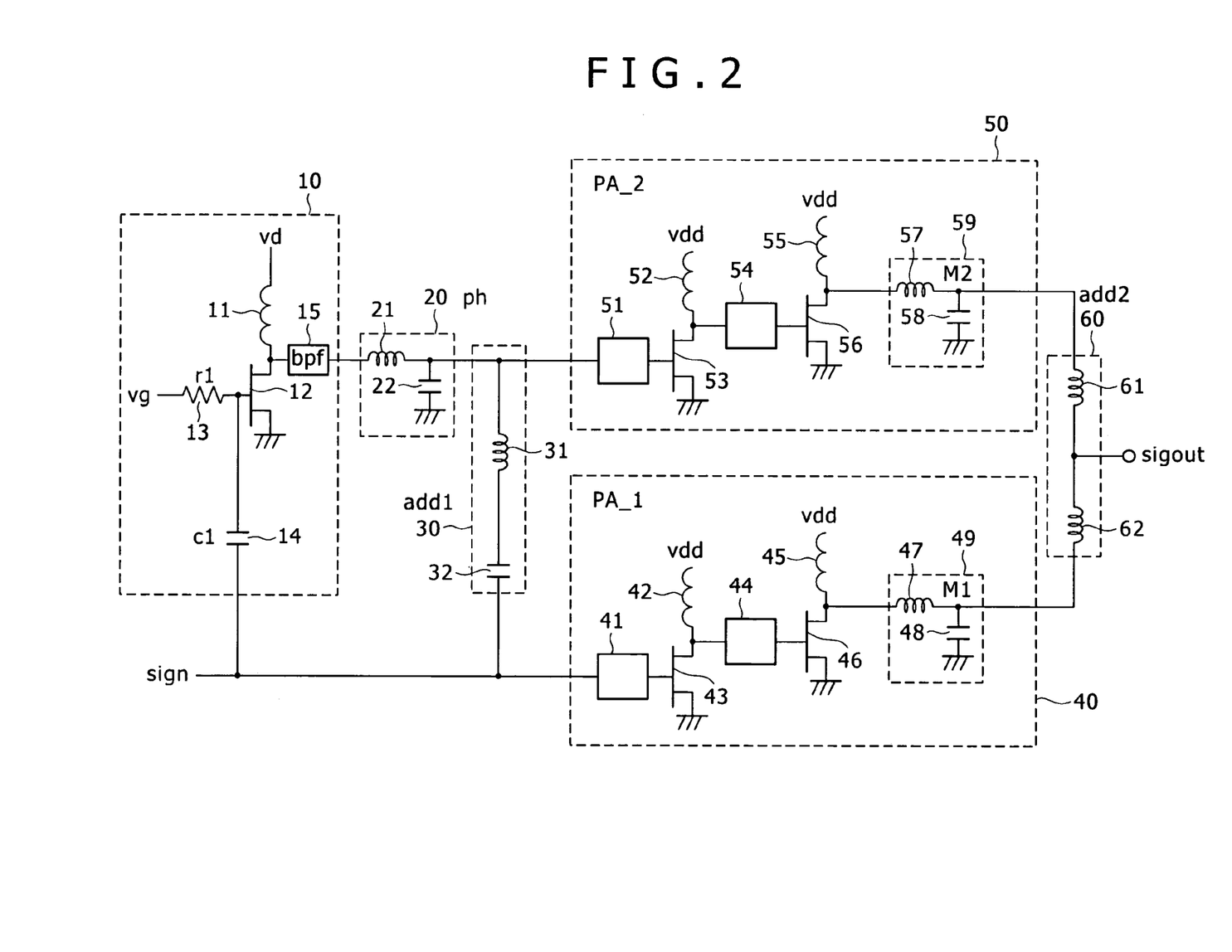
FIG. 2 is a detailed circuit configuration of the power amplifier system shown in FIG. 1.

FIG. 2 is a detailed circuit configuration of the power amplifier system shown in FIG. 1. In the drawing figure, portions corresponding to those shown in FIG. 1 are shown with the same reference characters.

In the second harmonic generator 10, a FET 12 (FET: field effect transistor) of a source-grounded type biased to the class C is used. A gate bias voltage vg is applied via a resistor 13 ("r1") to the gate terminal of the FET 12. In this case, a part of the input signal ("sigin") is split by a capacitor 14 ("c1") and is input. A drain voltage vd is applied to the drain terminal of the FET 12 via a coil 11. Further, a second harmonic bandpass filter 15 ("bpf") is coupled to the drain terminal of the FET 12. For the second harmonic generator, a frequency conversion mixer can be used in lieu of the bandpass filter 15 ("bpf"). In this case, the bandpass filter 15 ("bpf") is unnecessary.

In an output portion of the second harmonic generator 10, the phase shifter 20 ("ph") for adjusting the phase of the second harmonic is configured using an L-shaped connection circuit including a coil 21 and a capacitor 22. Thereby, only the second harmonic occurring in the Class C amplifier is extracted or drawn, and is into the subsequent second power amplifier 50.

The first adder 30 ("add1") is configured from a series circuit including a coil 31 and a capacitor 32.

The first power amplifier 40 has a configuration in which a plurality of FETs, namely an input FET 43 and an output FET 46, which are both of the source-grounded type, are connected. A matching circuit 41 is coupled to the gate of the input FET 43, in which the input FET 43 receives the input signal ("sigin") through the matching circuit 41. Further, a coil 42 is coupled to the drain terminal of the input FET 43, in which a drain voltage Vdd is applied through the coil 42. Further, there is provided a matching circuit 44 through which the drain terminal of the input FET 43 is connected to the gate terminal of the output FET 46. The drain voltage Vdd is applied to the drain terminal of the output FET 46 via a coil 45. The drain terminal of the output FET 46 is connected to one of input ends of the second adder 60 ("add2") via a matching circuit 49 for inputting the drain voltage Vdd thereto. The matching circuit 49 is configured from an L-shaped connection circuit including a coil 47 and a capacitor 48.

The second power amplifier 50 has a configuration similar to that of the first power amplifier 40. More specifically, a plurality of FETs, namely an input FET 53 and an output FET 56, which are both of the source-grounded type, are connected. A matching circuit 51 is coupled to the gate of the input FET 53, in which the input FET 53 receives the input signal from the first adder 30 through the matching circuit 51. Further, a coil 52 is coupled to the drain terminal of the input FET 53, in which a drain voltage Vdd is applied through the coil 52. Further, there is provided a matching circuit 54 through which the drain terminal of the input FET 53 is connected to the gate terminal of the output FET 56. The drain voltage Vdd is applied to the drain terminal of the output FET 56 via a coil 55. The drain terminal of the output FET 56 is connected to the other input end of the second adder 60

("add2") via a matching circuit 59 for inputting the drain voltage Vdd thereto. The matching circuit 59 is configured from an L-shaped connection circuit including a coil 57 and a capacitor 58.

The second adder 60 ("add2") includes two coils 61 and 62 series connected to, in which a summation output ("sigout") is drawn from a connection point or node between the coils 61 and 62.

Operation of the circuit configuration of FIG. 2 is will be described herebelow.

Figure 3:
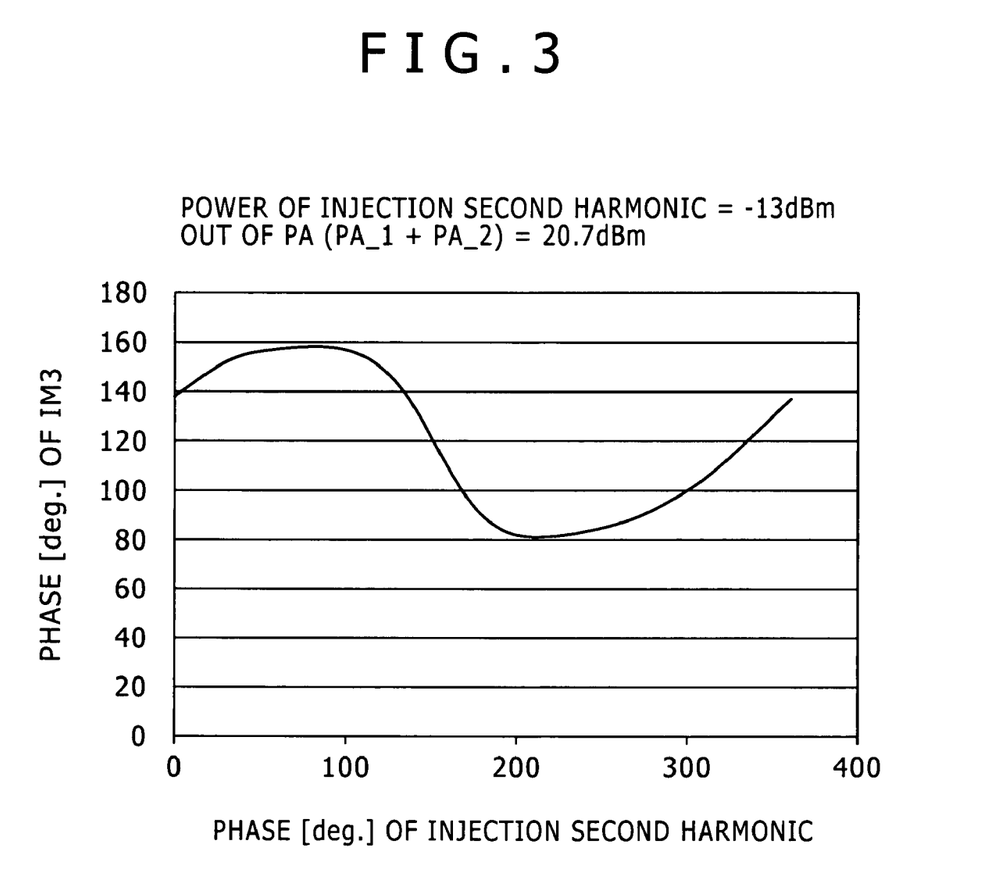
FIG. 3 is a graph showing dependency of a phase (θ) of IM3 contained in an output of a second power amplifier in FIG. 2 upon the phase of an injection second harmonic.

FIG. 3 is a graph showing dependency of the phase (the above-described phase θ) of IM3 contained in the output of the second power amplifier 50 of FIG. 2 upon the phase of a second harmonic for injection ("injection second harmonic," hereinbelow). It can be known from the graph that IM3 changes about 80 degrees with respect to a 360-degree phase change of the injection second harmonic.

Figure 4:
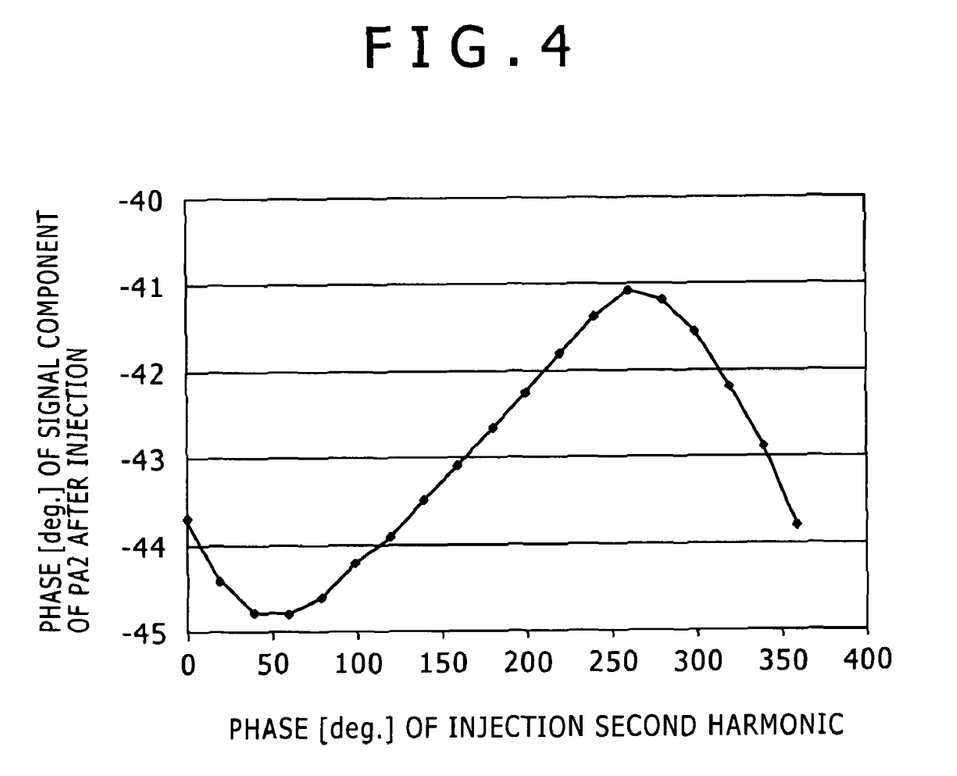
FIG. 4 is a graph showing variations in the output phase of signal components in the same state as that in FIG. 3.

FIG. 4 is a graph showing variations in the output phase of signal components in the same state as that in FIG. 3. According to the graph, only about 4 degrees is changed with respect to the 360-degree phase change of the injection second harmonic. In other words, it can be known that only the phase of IM3 can be controlled without influencing the phase variations in the signal component. Thereby, the phase can be adjusted to the phase of the second harmonic capable of canceling IM3.

Figure 5:
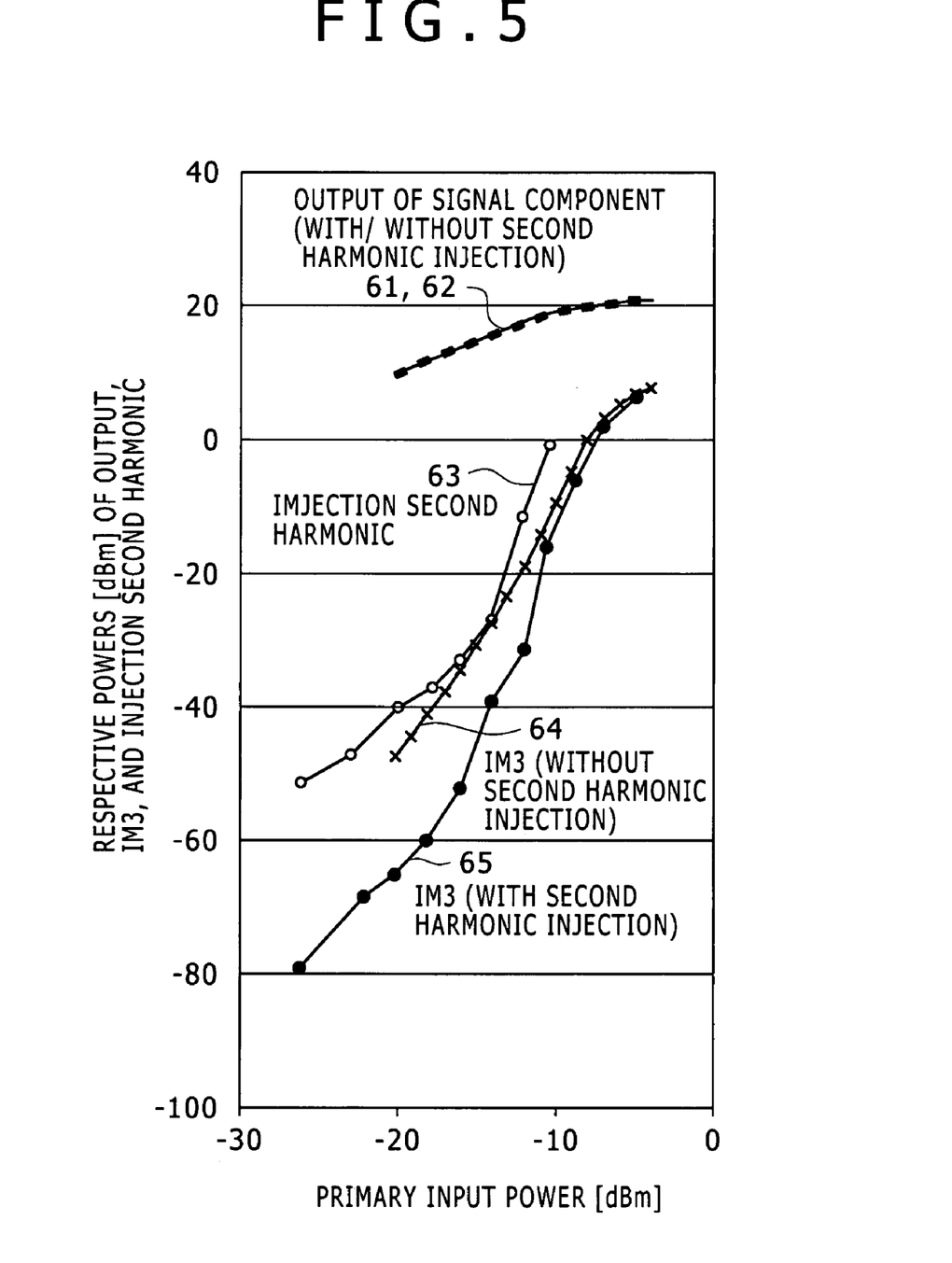
FIG. 5 is a graph showing input/output characteristics obtained in the circuit configuration of FIG. 2.

FIG. 5 is a graph showing input/output characteristics obtained in the circuit configuration of FIG. 2. The graph shows the characteristics of signal component outputs 61 and 62 with and without second harmonic injection, a third order intermodulation distortion (IM3) 64 without second harmonic injection, injection second harmonic 63 with second harmonic injection, and a third order intermodulation distortion (IM3) 65 with second harmonic injection corresponding to the level of primary input power. The data of the component outputs 61 and 62 substantially overlap one another (the solid line and the broken line) regardless of the second harmonic injection. As such, it can be said that no influence of the second harmonic injection is imposed. This is attributed to the fact that, as shown in FIG. 5, the phase variation due to the second harmonic injection is very small.

In the cases of the IM3 levels 64 and 65, it can be observed that the output characteristic is improved by about 10 dB as a result of the second harmonic injection. In the input power range of about −10 dBm or higher, the degree of improvement eventually or slowly deteriorates over time, but does not deteriorates lower than in the case of without-second harmonic injection. As described in Non-Patent Publication 2 (see (*2) below), such slow deterioration in the improvement occurs because an inflection point is present for the distortion compensation in accordance with the second harmonic injection scheme, and the distortion compensation becomes ineffective a power zone exceeding the inflection point.

(*2): S. Kusunoki, et al. "Load-Impedance and Bias-Network Dependence of Power Amplifier with Second Harmonic Injection", IEEE Transactions on Microwave Theory and Techniques, September 2004, vol. 52, No. 9, pp. 2169-2176

FIG. 5 shows also the level of the second harmonic injection. When the level of the second harmonic is adjusted at one arbitrary input point, no adjustment has to be done thereafter. It can be known from FIG. 5 that the level of the second harmonic is increased substantially at a ratio of a tilt "2" ("2" representing the tilt, for example) with respect to an input (that is, at the ratio of a 2-dBm increase with respect to a 1-dBm increase).

According to the configuration of the present embodiment, the operation is thus performed so that respective IM3 components similarly occurring from the two power amplifiers 40 and 50 are greatly cross-cancelled. The operation will be further described herebelow by using mathematical expressions.

An input/output characteristic under voltages of the respective power amplifiers (PA) is assumed to be as represented by expression (1) below.

$$Vo = G1 \cdot Vi + G2 \cdot Vi^2 + G3 \cdot Vi^3 + \tag{1}$$

In this case, an input signal into a first power amplifier ("lower PA," hereinbelow) can be represented by expression (2) below.

$$Vi = \sin(\omega t) + \sin(\omega + \delta)t \tag{2}$$

The respective amplitude is assumed to be 1 for convenience. A phase φ of the respective wave is assumed to be 0.

Then, expression (2) is assigned to expression (1) for further expansion. The parameter "$(3/2)\cdot\sin(\omega+2\delta)t$" occurs from the parameter "$3\sin(\omega t)\cdot\sin^2(\omega+\delta)t$" occurring in the third parameter (parameter of G3). More specifically, a third order cross modulation distortion component IM3L of the lower PA can be represented by expression (3) below.

$$\text{IM3L: } 3\sin(\omega t)\cdot\sin^2(\omega+\delta)t \to (3/2)\cdot G3\cdot\sin(\omega+2\delta)t \tag{3}$$

The input signal into the second power amplifier ("upper PA," hereinbelow) is represented as expression (4) below since the second harmonic is summed thereto.

$$Vi = \sin(\omega t) + \sin(\omega+\delta)t + \sin(2\omega t) + \sin 2(\omega+\delta)t \tag{4}$$

The input/output characteristic also is assumed to be the same as expression (1) above. The output of the upper PA can be obtained by assignment of the expression (4) to expression (1). In this case, the parameter "$-\cos(\omega+2\delta)t$" occurs from the parameter "$\sin(\omega t)\cdot\sin\{2(\omega+\delta)t\}$" occurring in the second parameter (parameter of G2. More specifically, a third order cross modulation distortion component IM3U can be represented as expression (5) below.

$$\text{IM3U: } \sin(\omega t)\cdot\sin\{2(\omega+\delta)t - G2\cdot\cos(\omega+2\delta)t \tag{5}$$

The phases φ and the amplitudes are now taken into account.

IM3 components for the combined output of the upper and lower PAs are represented as expressions (6) and (7) below.

$$\text{IM3L}: (3/2)\cdot G3\cdot V1\cdot\sin\{(\omega+2\delta)t+\phi 1\} \tag{6}$$

$$\text{IM3U}: -G2\cdot V2\cdot\cos\{(\omega+2\delta)t+\phi 2\} \tag{7}$$

The phases φ are significant only for the relative relation between the respective waves. As such, where φ1=0 degrees, and φ2=90 degrees, the IM3 is represented as:

$$\begin{aligned}IM3 &= IM3L + IM3U \\ &= (3/2)\cdot G3\cdot V1\cdot\sin\{(\omega+2\delta)t\} - \\ &\quad G2\cdot V2\cdot\sin\{(\omega+2\delta)t\} \\ &= \{(3/2)\cdot G3\cdot V1 - G2\cdot V2\}\cdot\sin\{(\omega+2\delta)t\}\end{aligned} \tag{8}$$
$$\tag{9}$$

That is, when the phase relation between φ1 and φ2 is set to 90 degrees and the amplitude is adjusted, expression (9) can be made to be zero. Thereby, IM3 components of the two power amplifiers are greatly cross-cancelled.

While the description has thus been made in the simplified manner, the coefficients G of expression (1) representing the input/output characteristics of the amplifiers PA are all complex numbers in practical applications. Further, since the phases have to be taken into account for applying expressions (2) and (4) representing the input signals, the operation becomes even more complex. In particular, specific attention should be paid when handling the phases of the signals. When the frequencies involved or being handled are the same, simple summation (or addition) and subtraction of the phase relations can be performed. However, when, as in the present embodiment, the frequency conversion is involved, the phases of the coefficients G are additionally involved. As such, for implementing a more precise approach, it is preferable that, as described in Non-Patent Publication 1, a method employing the complex Fourier transform be used.

The power amplifier system of the present embodiment is well suited for adaptation to a mobile phone terminal. Although the mobile phone terminal is specifically illustrated, the terminal includes, for example, a transmit portion, a receive portion, a data processing portion, an operation portion, a display portion, and an audio processing portion. In the mobile phone terminal, the power amplifier system of the present embodiment is used in the transmit portion.

While the embodiment of the present invention is described above in detail, various alterations and modifications can be made in addition to those described above without departing from the sprit and scope of the invention.

What is claimed is:

1. A power amplifier system, comprising:
   a first power amplifier for amplifying a primary input signal;
   a second harmonic generator for outputting a second harmonic by using a split part signal of the primary input signal as an input;
   a phase shifter for adjusting a phase of the second harmonic;
   a first adder for summing together a split part signal of the primary input signal and an output of the phase shifter, thereby to produce an output;
   a second power amplifier that uses the output of the first adder as an input; and
   a second adder for summing together an output of the first amplifier and an output of the second power amplifier, thereby to produce an output.

2. A power amplifier system as claimed in claim 1, wherein the first power amplifier is biased to any one of class A and class AB, and the second power amplifier is biased to the class C.

3. A power amplifier system as claimed in claim 1, wherein the second harmonic generator uses a source-grounded field effect transistor biased to the class C, wherein a bandpass filter for passing the second harmonic is coupled to a drain terminal of the field effect transistor.

4. A power amplifier system as claimed in claim 1, wherein a frequency conversion mixer is used as the second harmonic generator.

5. A mobile phone terminal, comprising a power amplifier system, wherein the power amplifier system includes:
   a first power amplifier for amplifying a primary input signal;
   a second harmonic generator for outputting a second harmonic by using a split part signal of the primary input signal as an input;
   a phase shifter for adjusting a phase of the second harmonic;
   a first adder for summing together a split part signal of the primary input signal and an output of the phase shifter, thereby to produce an output;
   a second power amplifier that uses the output of the first adder as an input; and
   a second adder for summing together an output of the first amplifier and an output of the second power amplifier, thereby to produce an output.

6. The mobile phone terminal as claimed in claim 5, wherein the first power amplifier is biased to any one of class A and class AB, and the second power amplifier is biased to the class C.

7. The mobile phone terminal as claimed in claim 5, wherein the second harmonic generator uses a source-grounded field effect transistor biased to the class C, wherein a bandpass filter for passing the second harmonic is coupled to a drain terminal of the field effect transistor.

8. The mobile phone terminal as claimed in claim 5, wherein a frequency conversion mixer is used as the second harmonic generator.

* * * * *